US010592215B1

(12) United States Patent
Eyberg (10) Patent No.: US 10,592,215 B1
(45) Date of Patent: Mar. 17, 2020

(54) UNIKERNEL CROSS-COMPILATION

(71) Applicant: NanoVMs, Inc., Oakland, CA (US)

(72) Inventor: Ian Eyberg, Oakland, CA (US)

(73) Assignee: NanoVMs, Inc., San Francisco, CA (US)

( * ) Notice: Subject to any disclaimer, the term of this patent is extended or adjusted under 35 U.S.C. 154(b) by 0 days.

(21) Appl. No.: 15/679,877

(22) Filed: Aug. 17, 2017

(51) Int. Cl.
| G06F 9/445 | (2018.01) |
| G06F 21/62 | (2013.01) |
| G06F 9/44 | (2018.01) |
| G06F 8/41 | (2018.01) |
| G06F 8/10 | (2018.01) |
| G06F 9/455 | (2018.01) |
| G06F 8/71 | (2018.01) |
| G06F 8/65 | (2018.01) |
| G06F 17/50 | (2006.01) |

(52) U.S. Cl.
CPC ............ *G06F 8/41* (2013.01); *G06F 8/10* (2013.01); *G06F 8/65* (2013.01); *G06F 8/71* (2013.01); *G06F 9/455* (2013.01); *G06F 8/443* (2013.01); *G06F 9/45558* (2013.01); *G06F 17/5045* (2013.01)

(58) Field of Classification Search
CPC ... G06F 8/65; G06F 8/71; G06F 8/443; G06F 9/45558; G06F 9/455; G06F 17/5045; G06F 8/54; G06F 21/6245; G06F 9/542; G06F 9/5072
See application file for complete search history.

(56) References Cited

U.S. PATENT DOCUMENTS

| 8,578,000 | B2 | 11/2013 | Van Wie | |
| 9,766,921 | B2* | 9/2017 | Allen | G06F 9/45558 |
| 9,886,303 | B2* | 2/2018 | Koller Jemio | G06F 8/54 |
| 9,904,527 | B1* | 2/2018 | Miller | G06F 8/443 |
| 2002/0099765 | A1 | 7/2002 | Otis | |
| 2004/0194116 | A1 | 9/2004 | McKee | |
| 2009/0119651 | A1 | 5/2009 | Slattery | |
| 2011/0307663 | A1* | 12/2011 | Kultursay | G06F 17/5045 711/125 |
| 2015/0033354 | A1 | 1/2015 | Wichmann | |
| 2015/0268978 | A1 | 9/2015 | Vu | |
| 2016/0087933 | A1 | 3/2016 | Johnson | |
| 2017/0132430 | A1* | 5/2017 | Sikka | G06F 21/6218 |
| 2017/0155724 | A1* | 6/2017 | Haddad | H04L 43/18 |
| 2017/0192825 | A1* | 7/2017 | Biberman | G06F 9/5072 |

(Continued)

OTHER PUBLICATIONS

Alfred Bratterud et al., IncludeOS: A minimal, resource efficient unikernel for cloud services, Dec. 2015, [Retrieved on Nov. 28, 2018]. Retrieved from the internet: <URL: http://folk.uio.no/paalee/publications/2015-cloudcom.pdf> 9 Pages (1-8) (Year: 2015).*

(Continued)

*Primary Examiner* — Anibal Rivera
(74) *Attorney, Agent, or Firm* — Van Pelt, Yi & James LLP (57) ABSTRACT

Building a unikernel is disclosed. Code is retrieved from a code repository. One or more unikernel build configuration options are identified. The code is analyzed to determine portions of an operating system required to execute the code. The code is compiled with the determined portions of the operating system into a unikernel that is deployable on a virtual machine to execute the code.

18 Claims, 6 Drawing Sheets

(56) References Cited

U.S. PATENT DOCUMENTS

| | | | | |
|---|---|---|---|---|
| 2017/0364377 | A1* | 12/2017 | Koller Jemio | G06F 8/54 |
| 2017/0366455 | A1* | 12/2017 | Pongracz | H04L 45/66 |
| 2018/0025152 | A1* | 1/2018 | Ben Ali | G06F 9/445 |
| | | | | 726/22 |
| 2018/0046446 | A1* | 2/2018 | Turovsky | G06F 8/65 |
| 2018/0069793 | A1* | 3/2018 | Narayanan | H04L 45/72 |
| 2018/0074843 | A1 | 3/2018 | Smith | |
| 2018/0091449 | A1* | 3/2018 | Tellez | H04L 5/14 |
| 2018/0115585 | A1* | 4/2018 | Rubakha | G06F 9/45558 |
| 2018/0165110 | A1* | 6/2018 | Htay | G06F 8/65 |
| 2019/0018715 | A1* | 1/2019 | Behrendt | G06F 9/542 |
| 2019/0205241 | A1 | 7/2019 | Huici | |

OTHER PUBLICATIONS

Anil Madhavapeddy et al. ,Unikernels: Library operating systems for the cloud, Mar. 16-20, 2013, [Retrieved on Oct. 24, 2019]. Retrieved from the internet: <URL: https://dl.acm.org/citation.cfm?id=2451167> 12 Pages (461-472) (Year: 2013).*

Prateek Sharma et al., Containers and Virtual Machines at Scale: A Comparative Study, 2016, [Retrieved on Oct. 24, 2019]. Retrieved from the internet: <URL: http://homes.sice.indiana.edu/prateeks/papers/a1-sharma.pdf> 13 Pages (1-13) (Year: 2016).*

* cited by examiner

```
6 lines (4 sloc) | 90 Bytes 1  version: 1
2
3  libraries:
4  - name: libxml2
5    remote: https://github.com/deferpanic/packages
```

302 brackets lines 3-5; 304 points to the remote URL.

FIG. 3A

```
6 lines (4 sloc) | 91 Bytes 1  version: 1
2
3  scripts:
4  - name: install dependencies
5    command: bundle install --path=gems
```

312 brackets lines 3–5

FIG. 3B

```
8 lines (7 sloc) | 185 Bytes
1  scripts:
2    - name: update
3      command: apt-get update
4    - name: install pip
5      command: apt-get install python-pip -y
6    - name: install flask
7      command: pip install --target=. flask
```

FIG. 3C

| | |
|---|---|
| 402 — Name | [ ] |
| 404 — Buildable | ☑ (Build from Github [default] or Upload Binary) |
| 406 — Multiboot | ☑ |
| 408 — Compiler | rumprun ◊ |
| 410 — Programming language | N/A ◊ |
| 412 — Source (github) | https://github.com/mycompany/myapplication |
| 414 — Command line parameters | [ ] |
| 416 — Environment parameters | [ ] |
| 418 — Script | Version: 1<br>description: my project description<br>buildpack: rails<br>scripts:<br>- name: clone redis client library<br>  command: git clone git://github.com/nrk/predis.git |
| 420 — Private Project? | ☐ (won't be visible to anyone) |
| 422 — Mutable Volumes? | ☐ |
| 424 — | [Choose File] No file chosen |
| 426 — | [ADD] |

FIG. 4

UNIKERNEL CROSS-COMPILATION

BACKGROUND OF THE INVENTION

In cloud services, applications are increasingly run on virtual machines. When run on virtual machines, the applications run on top of operating systems that run on the virtual machines. Often, a single application is run on a virtual machine, where communication between applications running on different virtual machines is done over a network. In such a scenario, many of the elements provided by the traditional operating system are not needed to run the application. These unneeded portions of the operating system lead to the inefficient use of computing resources that may negatively impact the performance of the application, and further provide potential vectors for attacking the virtual machines. Accordingly, there is an ongoing need for systems and techniques capable of efficiently and securely running applications.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Described herein is a unikernel platform. As will be described in further detail below, an application is combined with only those portions of an operating system that are needed to form a unikernel machine image. The deployed unikernel may then be run and booted into on a virtual machine (vm) hypervisor or on bare metal, without a host or underlying operating system.

In the examples described herein, unikernels are single process, cannot be sshed into, and include only those parts of an operating system that are needed for the process to run. This results in various efficiency and security benefits.

For example, with respect to efficiency, due to the unikernel including only the minimal components needed for the single process application to run, the average size of a unikernel may be kept smaller than that of a typical application running on a traditional operating system. This reduces the amount of memory used. Further, due to the relatively small size of the unikernels, many vms (e.g., thousands) may be implemented on a single commodity host, which may be orders of magnitude greater than the number of vms that can be spun up on traditional systems.

As another example, when booting up a unikernel, the unikernel boots straight into the application. There is no initialization process that spawns off multiple processes. This is in contrast to traditional operating systems, where, for example, when booting into Linux, BSD, etc., a process scheduler is started. As the unikernel is a single process system, such process scheduling is not performed. This, coupled with the smaller size of the unikernels, also results in faster boot times.

As another example benefit, unikernels, when deployed, are isolated, single process systems (versus, for example, a multi-process system such as Linux). Thus, shared memories/address spaces are not needed. For example, in a multi-process operating system such as Linux, there is an address barrier between different processes, which will have different virtual address spaces. The barrier is to ensure that processes do not overwrite each other's memory addresses. Context switching (e.g., between user space and kernel space and/or between processes) is performed. With unikernels, which are single process, such context switching need not be performed. Thus, the overhead to managing different address spaces is removed, resulting in faster and more efficient running of the application.

Running unikernels also provides various security benefits relative to applications run on traditional operating systems. As described above, unikernels, once deployed, cannot be accessed through a channel such as that provided by SSH (Secure Shell). For example, users may be unable to log into deployed unikernels. Further, shell code cannot be executed on the single process unikernel system. This removes shell code exploits as an attack vector.

Figure 1:
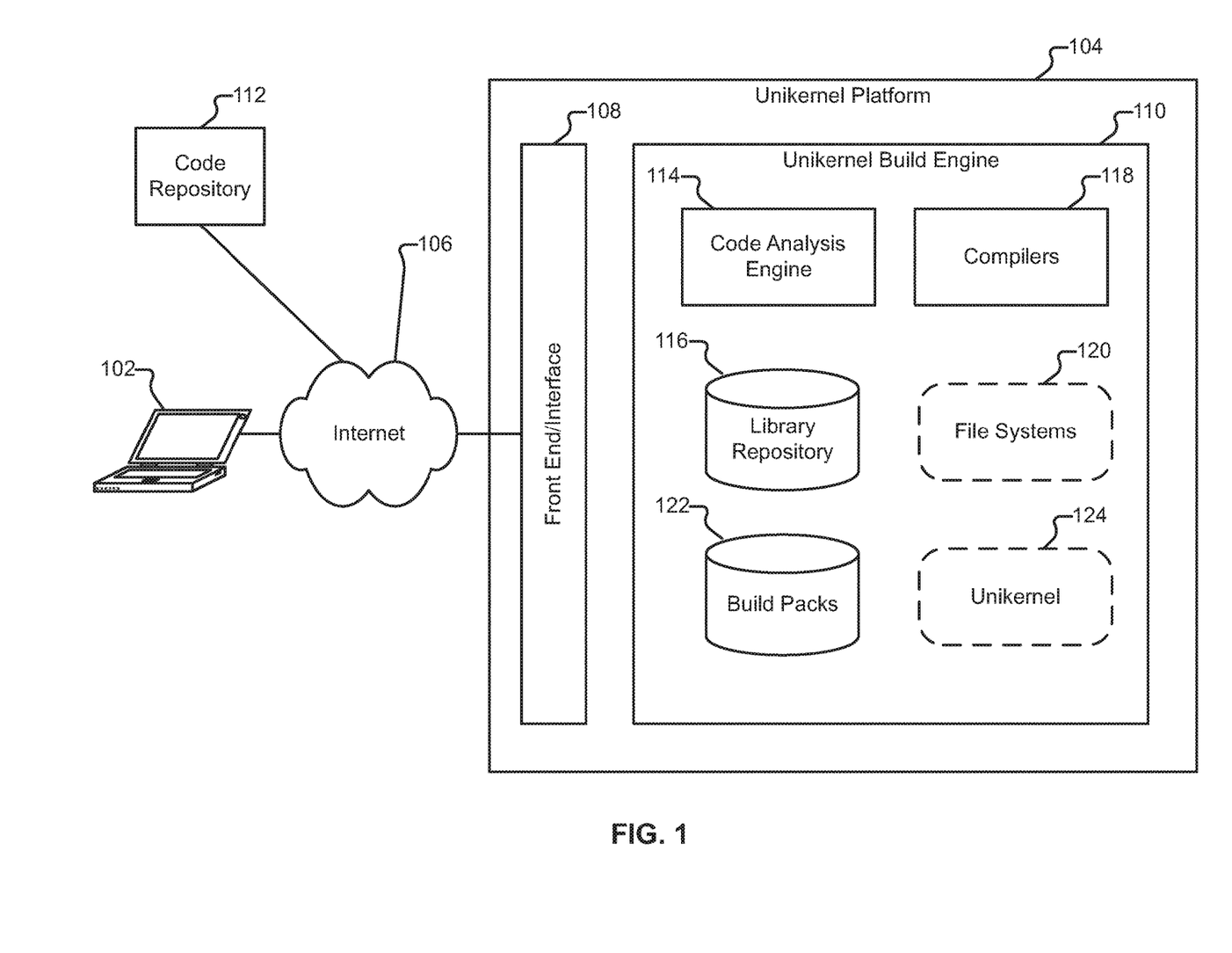
FIG. 1 is a diagram illustrating an embodiment of an environment in which unikernels are built.

FIG. 1 is a diagram illustrating an embodiment of an environment in which unikernels are built. In this example, a user (e.g., a DevOps user) wishes to build a unikernel to run an image processing application that is written in Ruby (e.g., to run on the Ruby on Rails framework). In order to do so, in this example, the user accesses, via laptop 102 (or any other device/terminal as appropriate, such as a desktop, mobile device, tablet, phablet, etc.), unikernel platform 104 to configure and build the unikernel.

When building a unikernel, the user code (for the image processing application in this example) will be combined with only those portions of an operating system that are needed for the application to run to implement a minimal virtual machine. These portions of the operating system include portions of an operating system kernel (e.g., network and disk drivers). The portions of the operating system also include dependencies that the application code relies on, such as libraries and header files. There may be various levels of dependencies. As one example, the dependencies may be based on the type or purpose of the user code. In this example, because the application to be run is an image processing application (e.g., for an image hosting website), the image processing application may rely on an existing image processing library. The dependencies may also be language specific. In this example, because the image processing application is a Rails web application, then the linking against a particular Ruby interpreter (e.g., 2.x or 3.x) may be required. As another example, the Ruby language will have a dependency on Bundler to manage the Ruby application's gems. If the code were instead written as javascript, there will be a dependency on npm. Different languages may have their own dependency management systems. In this example, because the application is an image processing application written in Ruby, the application may need to link, for example, to the libraries ImageMagick and RMagick.

In typical applications, such dependencies and libraries would be dynamically linked in at runtime. In unikernels, this is not allowed (because unikernels cannot be accessed after they are deployed, and are single process), and thus the linking must be frontloaded and done prior to deployment (in contrast, for example, to Puppet, Chef, or Docker, where dynamic linking of libraries would be done at a later time).

As will be described in further detail below, platform 104 determines what portions of an operating system (e.g., dependencies such as those described above) are needed to execute the application as a minimal virtual machine. For example, the determination may be made based on configuration options declared or specified by the user in a configuration user interface (e.g., based on a specified language of the application code), where a user may also explicitly declare various build process configuration parameters and dependencies (e.g., libraries) to include with their code (e.g., in scripts or build packs, as will be described in further detail below). The portions of the operating system to combine with the user code may also be inferred, derived, or otherwise determined based on an analysis of the user code, which will also be described in further detail below.

Configuring the Unikernel

In this example, the user configures the unikernel over a network 106 (e.g., the Internet) via a configuration user interface (e.g., browser-based web interface) provided by front end 108 of platform 104. An example of a configuration user interface is described in conjunction with FIG. 4. Via the configuration user interface, the user may declare or specify various unikernel build configuration parameters/variables/options associated with their unikernel. The following is a list of example unikernel configuration options.

Name:

The user may enter a name for the unikernel that they are requesting to have built.

Buildable:

This is an option where the user may indicate whether the unikernel is to be built from a repository (which may be done by default) or whether a binary is to be uploaded.

Multiboot:

This is an option that allows the user to indicate whether the code is a disk image or multi-boot compatible code.

Compiler:

This is an option that allows the user to declare or select what compiler they would like to use for building their unikernel. Various compilers, such as cross compilers, may be supported (e.g., rumprun, OSv, etc.). The cross compilers may be specialized. For example, cross compilers may be language specific. As one example, mirageOS may be specified for OCAML code.

Programming Language:

This is an option to declare a language in which the user code is written (e.g., PHP, Java, Ruby, etc.). As described above, applications may have different dependencies based on the language in which they are written. Declaring the language may save compile time, as appropriate libraries may be determined if the programming language is declared. As will be described in further detail below, if the user does not explicitly declare the language of the user code, the code may be analyzed to determine the language in which it was written.

Source/Code Location:

The user may specify a source of their user application code (e.g., for the image processing application in this example). For example, the user enters the location (e.g., link) to the user application code. As one example, the user inputs the link or URL to the code repository (e.g., Github repository) on which the application code is maintained.

The user may wish to specify various options/parameters to be passed into their application, where such options/parameters may change on the fly. Examples of such parameters include command line parameters and environment parameters.

Command Line Parameters:

This is an option to specify command line options to be passed to the unikernel. For example, in Java, various command line options may be routinely passed to a Java program (e.g., in the context of Java Virtual Machines (JVMs)). The command line parameters specified by the user are passed into the unikernel.

Environment Parameters:

Deployed applications often need to access environment variables. As one example, if the deployed application is configured to communicate with a database, the Internet Protocol (IP) address, port number, or Domain Name Server (DNS) name for the database may be set as an environment variable for the deployed code. Such an environment variable may change dynamically (e.g., day to day, hour to hour) and the user may not wish to redeploy the image or recompile the image every time the environment variable/parameter changes. Thus, the environment variables are not included in the image, but are made accessible to the image. The user may specify environment variables in this field of the configuration UI.

Private Project?:

This configuration option allows the user to indicate whether the unikernel is private (i.e., the unikernel image will not be publicly accessible or visible to anyone).

Mutable Volumes?:

There may be a number of situations in which the file system associated with the unikernel is changed after the application is deployed. For example, those applications that modify databases will mutate the file system. Various caching will also mutate the file system. In some cases, however, the file system is static and will not be mutated. For example, the code for a web application may not make any modifications to the file system and may be stateless (e.g., a stateless microservice), where there is no modification to the disk. In such a scenario, the user may then indicate that the volume is not mutable. If the volume is indicated as not mutable, when the unikernel is built, the file system is made read only (e.g., the file system is mounted as read only, where write permissions are not added to the file system), where the unikernel is built as a static system. Making the file system read only provides further security benefits, as it removes another vector by which the unikernel can be attacked (e.g., by preventing an attacker from mutating the file system to inject nefarious code).

Choose File:

If the user is performing local development and already has an image of a built unikernel that they would like to deploy, they may use this configuration option to upload the unikernel image directly to the unikernel platform (in which case the building of a unikernel need not be performed).

As described above, the dependencies of the user program/application (as well as how they are to be combined/compiled with the program) may be explicitly specified or declared by the user. One example way of declaring dependencies is through the use of scripts that are also referred to herein as "build packs." An example of a build pack is described in conjunction with FIGS. 3A-3C. The build packs may also be used to pre-specify at least some of the build configuration options described above.

Script (Build Pack):

This option allows the user to declare a set of dependencies, which are to be automatically included in the unikernel image. In this example of a Ruby on Rails imaging application, there may be hundreds of different "gems" that may need to be installed in order for the application to run. The build pack script may be used to specify or declare, up front, the various operating system options (e.g., libraries, system calls, flags, etc.) needed by the unikernel. For example, if the user knows that they will need to link against a redis cache, then they may explicitly specify a corresponding library to include in the unikernel image to be built. The script may also be used to declare or explicitly set any other build process configuration parameters.

The user may enter the code for a new script as a configuration option, which may be saved for later reuse (e.g., if the user decides to build another unikernel that will link to the same libraries, they can reuse the previously created build pack so that they do not need to re-specify the configuration options every single time they build a new unikernel). The user may also select from existing build packs (e.g., by forking or cloning another script), such as those previously created by the user, or stock scripts provided by default by platform 104. Build packs may be selected from a data storage such as build pack database 122.

When specifying a build pack, the libraries to include in a unikernel may be declared. In some embodiments, pre-configured libraries provided by platform 104 may be selected. The pre-configured libraries may include pre-compiled libraries that fit most users' purposes. The location of a pre-configured library is specified, for example, by a link (e.g., URL). In some embodiments, when the pre-configured library is downloaded, the source of the library is not downloaded. Instead, what is downloaded is a hashed, verified version of the library (e.g., verified by the operator of platform 104) that can be used for the application. The use of such pre-configured libraries speeds up compilation time. There are also security benefits, where the hashed/verified code is hosted, for example, by the operator of platform 104, negating man in the middle attacks or attempts to modify the libraries.

Libraries to include or existing build packs may also be suggested to users based, for example, on the setting of other configuration options such as those described above. For example, if the user selects a particular language, known packs of libraries applicable to the selected language may be suggested to the user. These may include external libraries, as well as the verified/hashed pre-configured libraries described above.

As part of including the libraries, various other parameters and options may be sent. For example, when linking against a particular library, various C flags may need to be set. A build pack script may be configured to indicate that these flags are to be set when building the unikernel image.

In this example, after specifying the configuration options for their unikernel to be built via the user configuration user interface, as described above, the user requests that a unikernel be built based on their build configuration options. For example, the user clicks on a "Build" or "Add" button in the configuration UI. As one example, the output of the configuration is a file (e.g., a yaml configuration file) that includes the user-specified configuration parameters for the build environment. As will be described in further detail below, the unikernel is then built. The unikernel may then be deployed or launched, placed on a network, provided whatever resources are needed, etc. Further details regarding deployment are described below.

Building the Unikernel

Platform 104 uses the user-specified configuration information to build the requested unikernel. In this example, platform 104 includes unikernel build engine 110, which is configured to build unikernels.

Isolated Build Environment

In this example, when the requested unikernel image is built, it is isolated in its own build environment from other builds. For example, when the user's request to build their unikernel comes in, there may already be several other ones being built (which may be queued in platform 104), and the different builds are isolated from each other during the build process.

In this example, the isolated build environment cannot be reconfigured and cannot be sshed into. As the unikernels cannot be accessed once the image is built, the images do not call out to other binaries, and therefore, dependencies are linked or baked into the image directly. For example, the installation of the libraries at runtime would require multiple processes to be run, which are not allowed in the unikernel. Thus, the dependencies are installed at build time, as described herein.

Within the build environment, the various components that are needed to build the image, such as libraries upon which the user code depends, are cloned and automatically linked in. For example, if the code needs access to libraries for communicating with a particular image processing library such as ImageMagick or RMagick, then the library is automatically cloned and linked in/combined with the application code. The dependencies (e.g., libraries) may be obtained from various sources (e.g., external sources) and installed inside the build environment, as will be described in further detail below. Pre-compiled libraries (that are hashed and verified) may also be obtained from a repository such as library repository 116.

Unikernel build engine 110 retrieves the user code from the source code location specified by the user. For example, the user code is retrieved from a code repository 112 such as Github using the source link or uniform resource locator (URL) declared by the user.

The unikernel build engine is also configured to determine or otherwise obtain the dependencies to be included in the unikernel being built, as will be described in further detail below.

Determining Dependencies

If the dependencies (e.g., libraries) to be included are declared up front (e.g., through build packs, as described above), then the declared dependencies are obtained and installed automatically. The build engine may also determine dependencies based on the configuration options declared by the user. For example, if the user declares the language via the configuration UI, dependencies corresponding to the declared language are obtained and installed. As described above, interpreted languages (e.g., Ruby, PHP, Python, etc.) may make use of various libraries. Some services, such as Wordpress, may require a set of dependencies in order for the system to run. The set of libraries that are obtained include hashed, verified, pre-compiled libraries, such as from library repository 116, as described in further detail below. Libraries may also be obtained from external sources.

Code Analysis

If the dependencies or language is not declared, the unikernel build engine is configured to determine or infer portions of an operating system to include in the unikernel based on an analysis of the user code, for example, using code analysis engine 114. The code analysis may also be performed when dependencies or languages are declared explicitly up front by the user.

Several standard assumptions may be made, for example, if the application is a web application. If the language of the application is not declared, it is derived, for example, by evaluating file extensions and abstract syntax trees (ASTs).

As described above, unikernels are built in isolated build environments. As one example, when the new application code is pulled from repository 112, it is placed into a chroot with a preset environment. In addition to providing build isolation, the build environment also has defaults built in. For example, if an interpreted language is being used (e.g., PHP, Ruby, Python, etc.), libraries are statically linked in at compile-time of the language interpreter itself (and not the user supplied code).

Further, these languages typically have different major versions used by users, such as Ruby 1.9× or 2.4×, or Python 2.7 and Python 3.

For example, if image manipulation is to be performed, libgd and libpng may be needed. Further, many language parsers depend heavily on libxml and libxslt.

In one embodiment, the code analysis engine is configured to use a tool (e.g., Holmes) to search for specific application programming interface (API) calls and includes in the user-provided source application code. For example, in Ruby, required lines that include extra code may be evaluated. This code is expected to be available on the path for the interpreter to find. Typically, in a language such as Ruby, users will have a Gemfile listing their external (Ruby) dependencies, which are then pulled down (e.g., from an external location) or otherwise obtained. What may not be present are the native C bindings and C libraries. These are expected to be installed, for example, via apt-get or any other appropriate provisioning tool that a sysadmin/DevOps user might use. Such provisioning tools include Chef, Puppet, or salt. The bindings and libraries may be in a container ecosystem and obtained accordingly.

In contrast, when building unikernels, the binary is effectively being provisioned versus the server (the binary and the server become, effectively, one and the same). Thus, for example, if a gem with "require 'pq'" is detected, which causes the pq gem to be obtained, then it is determined that 'libpq' should be linked into the interpreter. Similarly, if mysql2 is detected, then the code analysis engine determines that the application should be linked against 'libmysqlclient-devel'.

Furthermore, in a language such as Ruby, these gems typically have C files inside of them that have specific headers that may be important or needed. In one embodiment, the code analysis engine is configured to perform pattern matching against these headers. If the headers are not included, then a foreign function interface may be used (where clues or hints are obtained from the source, as there may be indications of when that is happening and the headers are not included).

There are also language specific ways of including flags such as CFLAGS and DFLAGS for these to link to certain libraries. In some embodiments, metadata is used to describe flags attached to libraries that have been pre-compiled (e.g., provided by the unikernel platform).

This leads to a list of patterns that the code analysis engine may use to determine whether to include certain dependencies. For example, a set of patterns may be used to determine whether to include postgres support versus mysql support, or, if image manipulation is to be performed, whether to include libgd and libpng.

For example, consider the relationship between libgd and libpng with a language such as PHP, which may be made more complex due to global scope. There may be certain function names such as "imagecreatefrompng( )" that "stomp" the global scope. In such a scenario, it is determined that libpng should be obtained and linked into the interpreter.

In this example, upon determining, based on the analysis of the code, what libraries to include, pre-compiled, hashed libraries are pulled or otherwise obtained from a library repository such as library repository 116. These pre-compiled, hashed libraries are libraries that are known by the system to link correctly, saving compile time and other resources. For example, linking the library may involve not only the static library itself but also (linker) LDFLAGs and (compiler) CFLAGS, which may be included in metadata that is attached to each of the pre-compiled, hashed libraries.

Typically, in an operating system such as Linux, a system administrator or DevOps user would manually, or through a tool, invoke, for example, "apt-get install libysql-dev." Using the techniques described herein, downloading, modification of the library itself (for example, no forks, no shared memory, etc.), compiling of the libraries, and linking of the libraries are performed automatically.

Typically, these libraries are not frequently updated, and if they are, the modifications are typically minor API changes and not major versions that would cause the foreign function API to fail. Thus, pre-compiled versions of the libraries are generated and stored in a bucket such as repository 116 for re-use.

Confirmation of what dependencies to include may also be performed. As one example, the confirmation is performed by dumping the abstract syntax tree (AST) of the user-supplied code and performing analysis of the AST.

The AST shows the code represented in a tree format of tokens that is generally emitted by the language parser. For example, in Go, it may be determined whether or not a given import is an import inside the codebase, or whether it is an external (e.g., third party) import. This information may be used to determine whether a given function declaration satisfies an interface.

In other languages, the AST is followed from node to node, and node names are evaluated. The node names (and types) are matched to what is expected. Therefore, for example, a class called MySQL followed by an object that is a constructor of that class called Open is an indication that the user code is attempting to open a MySQL connection.

For compiled languages such as C, headers are evaluated and inferences may be performed to determine what dependencies to include and link against. For example, referring to the example of Ruby, if there is a header in a gem for libpq-fe.h, then it is inferred that libq should be linked against, whereas a header for mysql2 ext.h should link against libmysql.

Thus, evaluation of headers may be used to infer or otherwise determine what libraries to include and link against. A typical operating system such as Ubuntu will include hundreds or thousands of such libraries (e.g., in /usr/lib, /lib64, etc.). By inferring or otherwise determining only those libraries that are needed by the user application code (e.g., only including ten or less libraries instead of the hundreds or thousands that are typically included by default with an operating system), the unikernel image size may be made much smaller than when traditional operating systems are used. The attack surface is also dramatically reduced. For example, the library libxml, which is linked to many interpreted languages by default, comes with a built in ftp server. If such an ftp server is not needed, it is removed from the unikernel.

For languages, such as Go/Java, such native C libraries need not be considered. For example, for languages such as Go, links to external C libraries are typically avoided, as they interfere with the Go memory models. For languages such as Java, native C libraries may be exposed, for example, through the Java Native Interface (JNI). Their exposure may be indicated by the use of the keyword "native."

Interpreted languages may link against the C libraries for speed and convenience. For example, some operations performed in image libraries may be too central processing unit (CPU) intensive in languages like Ruby or Python. This may be similarly observed for cryptography and transport layer security (TLS) libraries, where, for example, some crypto libraries are commonly used for storing passwords in databases. Dependencies of this type are typically associated with interpreted languages.

Thus, using the code analysis techniques described herein, the libraries and other dependencies needed for the user code may be determined and obtained.

Build engine 110 is also configured to make use of aspect oriented programming (AOP) tools such as goweave, which are used to perform efficient instrumentation and enumeration. Such a tool performs similarly to the AST inspection described above, but allows for re-writing of the source code as it is inspected. Various call points may also be hooked into the source. This may be done for debugging.

One example of the enumeration is for dead code elimination. Dead code elimination may be used to remove excess code from a binary. The user code body may be dynamically instrumented and profiled without changing the underlying code.

The AOP tool may also be used to shortcut/stub out calls (e.g., system calls) that will not work. The following is an example in the Go programming language:

```
aspect {
  pointcut: execute(blah(stuff string))
  advice: {
    before: {
      if stuff=="stuff"{
        return false
      }
    }
  }
}
```

Using the above function, each time that the "blah" method is run that is declared to have a string variable name 'stuff,' check to ensure that 'stuff' equals the string "stuff"—if it does, the function returns false. The "before" clause portion in this example indicates that this check is to be performed before performing other processing. Thus, large amounts of code may be stubbed out automatically.

As described above, various call points may be hooked into the source code. These call points are addressed, as shown in the above example code, using a "pointcut," which is similar to regexen applied to an AST. For example, functions with certain names, or variables with a certain type may be searched for. Ad hoc code (e.g., the "advice" in the above Go example) may then be inserted to various sections as they are found, effectively re-writing the AST on the fly. The "advice" may be inserted before a function call, after a function call, or inside a function call.

Thus, using the techniques described above, code modification may be performed. Further, the complex pattern matching on the AST described above may be used to identify spots in the source codebase where problems may potentially occur (e.g., that would result in execution of the code failing). For example, the call graph for the code may be determined as described above, with code paths evaluated (e.g., what functions call what other functions may be determined) to determine whether the application will work without modifications. Modifications such as the system call rewrites described above may be performed to make the application work. The user may then be notified by the system of these problem spots, where human intervention may then be taken.

Other modifications to system calls may be made. For example, system calls may be rewritten to allow encryption to be performed on-the-fly on reads and writes. As described above, some system calls are stubbed out. This includes system calls that cause processes to fork (i.e., calls for forking are rewritten, or symbol information is removed). Because the unikernels are run as single process systems, forks (which create new child processes) are not allowed and are removed (by stubbing them out).

In some embodiments, if inspection of the user indicates that the application will not work, then the unikernel is not built, or the user is notified that human intervention is needed to correct problem areas.

In addition to identifying libraries and other associated metadata (e.g., flags) that the application depends on, build engine 110 is also configured to cache files that are typically found on a file system, such as locales, SSL certificates, etc. This may be provided to the user automatically. Daemons to be installed in the build environment may also be obtained.

Multiple file systems may be mounted or otherwise associated with the unikernel/vm being generated. For example, multiple file systems (e.g., file systems 120) may be attached to accommodate the different types of files that may be associated with the unikernel, such as system type files, configuration files (which may or may not change dynamically), and configuration information. In the examples described herein, the file systems used are similar in structure to those utilized on other operating systems (e.g., etc file system in Linux or BSD), with libraries placed in certain locations in the file system so that they may be accessible by the application. However, as described above, cross-process communication is prevented.

Compiling the Unikernel Image

Upon determining the portions of the operating system required for the user application to run, the determined operating system portions are compiled with the user application code to generate a unikernel machine image.

If a user has declared a compiler (e.g., cross compiler) to use, then the declared compiler is used. If a compiler is not declared, then a compiler can be selected, for example, based on the language of the user application code (whether declared by the user or automatically detected from an analysis of the user code).

The user code, file system, ssl certificates, determined libraries, etc. are sent to compiler 118 of platform 104 to build a unikernel image (where the platform may have many compilers, and an appropriate one for building the unikernel image is selected). In some embodiments, instances of the required libraries are compiled into the unikernel image, as shared libraries may not be used in the single process unikernel systems.

Portions of the underlying kernel of an operating system are also included in the cross compilation. This includes the minimum portions of the kernel needed to run the application. For example, typical web applications that are deployed need only to communicate with the disk and the network, and while the disk and network drivers are included in the unikernel image, other components that are typically included in an operating system, such as universal serial bus (USB) drivers, sound drivers, mouse drivers, etc. can be excluded from the unikernel image. Other portions of the OS kernel may be excluded, such as those components related to inter-process communications, as multiple processes are not allowed. Kernel portions related to shared memory are also not needed. For example, due to the unikernel (which will be run, for example, on a vm) being a single process system, cross-process communication within the system is not allowed. If two processes are to talk to each other, then they are implemented as two different virtual machines (running two different unikernels). Thus, a single vm will not have multiple processes running on it. The two vms would communicate across the network (e.g., using network drivers, which would be included in the unikernel image), rather than through inter-process communication (and thus, those portions of a traditional operating system related to inter-process communication may be excluded from the unikernel image).

Certain system call libraries are also not needed, such as those related to semaphores, process signaling, etc. If a hypervisor that the image is to be run on is specified by the user, any drivers needed to talk to the hypervisor are also included in the unikernel image.

The unikernel image also includes the code for a bootloader that performs system setup, such as setting up page tables, so that the unikernel will boot into the application when deployed and run.

The process for combining/compiling the user code with the determined portions of the operating system may depend on the type of language that the user code is written in.

For example, if the user code is written in an interpreted language (e.g., Ruby, php, javascript, etc.), then the interpreter itself is modified to link to the appropriate libraries (the user code is not modified to link to the libraries). As described above, libraries are statically linked in at the compile time of the language interpreter itself If the user code is written in a compiled language (e.g., C, Go, etc.), then the actual binary itself is modified. For example, the user code is first compiled to generate a binary. The start point (e.g., main) of the binary is then modified to link against the determined portions of the operating system (e.g., an executable and linkable format (ELF) file is rewritten).

Thus, after the compilation process, a minimal virtual machine to implement (unikernel image) is generated as output (e.g., unikernel 124).

Deploying the Unikernel

The built unikernel images are then outputted and may be deployed. As one example, unikernels may be run directly on hardware (e.g., bare metal). As another example, the unikernel is deployed on servers implemented as virtual machines (e.g., the unikernel image is run on a hypervisor), where the unikernel boots directly into the application. As described above, unikernels may be booted into a targeted hypervisor, such as kvm, esx, xen, etc. If an exception occurs, then the vm will halt.

In one embodiment, the unikernel is deployed on an infrastructure provided by unikernel platform 104, for example, in a public facing sandbox provided by platform 104. As another example, the unikernel is deployed or implemented on an on premises (e.g., of a customer or subscriber of unikernel platform 104) infrastructure, behind a firewall. For example, the user is given a version of the system that they can run on their own hardware. As one example, an ipxe provisioning system is provided as output, which allows the specification of disk images when a computer boots up, allowing the computer to boot into the unikernel as a vm. A license may be obtained/provided to perform the on-premise deployment of the unikernel.

Unikernel Modifications and Redeployment

As described above, because unikernels cannot be sshed into after being deployed and must be configured prior to being built, interfaces are provided that facilitate passing of parameters (e.g., command line and environment parameters) to the unikernel. The redeployment of volumes may similarly be facilitated. For example, suppose that the user wishes to deploy a new change. It would be inconvenient for the user to have to recompile the unikernel image every time that a new change is deployed. In some embodiments, if the user code is interpreted (e.g., Ruby, Python, etc.), volumes may be remounted on the fly as deploys. For example, even though the user code has changed, the interpreter does not need to be rebuilt each time that new user code is to be deployed. The new code is pushed as a new volume that uses a base image.

Example Garbage Collection Testing in a Unikernel Environment

The following is an example for performing debugging in a unikernel environment. Suppose, for example, that a Go compiler is being created. In this example, the garbage collection is to be tested. One way to trigger garbage collection is to have an object exceed a certain size. Typically, the results (e.g., statistics and measures) of the garbage collection are then analyzed. However, in the unikernel environment, there may be no such facility to run the software and analyze the results to view garbage collection statistics.

In one embodiment, to facilitate testing, a test program is written as a unikernel, which is then booted up into a hypervisor such as KVM. The results (e.g., garbage collection statistics) are then screen-scraped out to verify that garbage collection was run.

Figure 2:
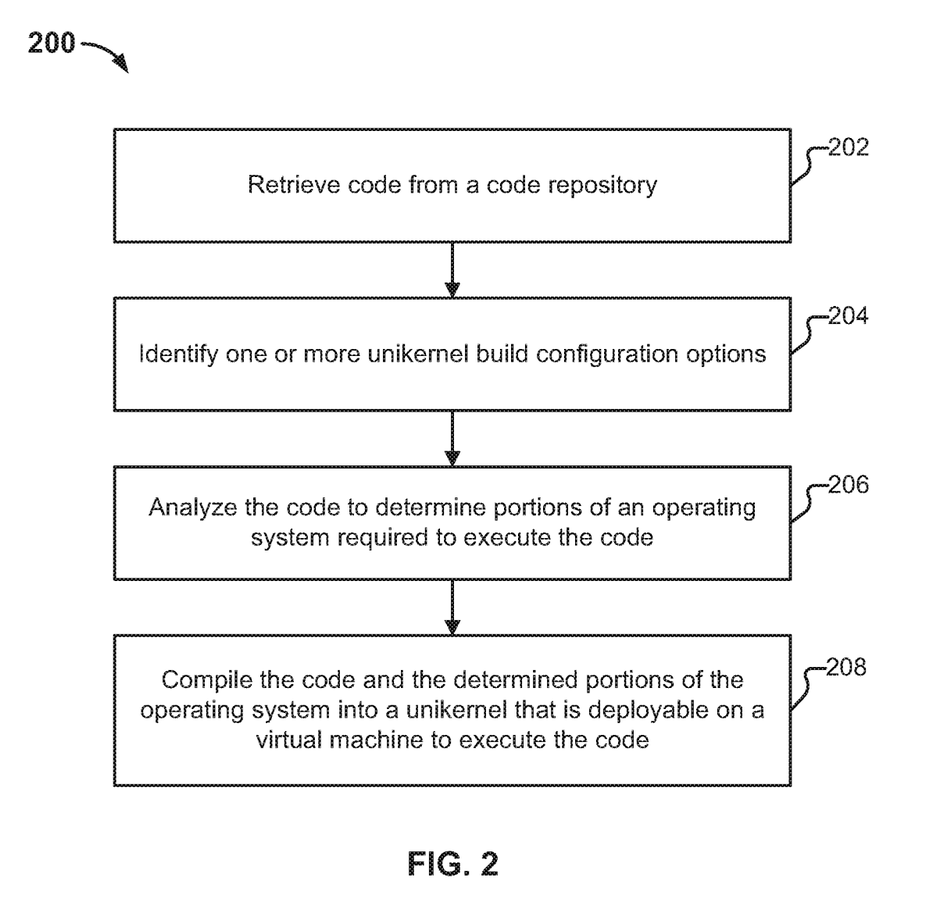
FIG. 2 is a flow diagram illustrating an embodiment of a process for building a unikernel.

FIG. 2 is a flow diagram illustrating an embodiment of a process for building a unikernel. In some embodiments, process 200 is executed by platform 104 of FIG. 1. The process begins at 202, when code from a code repository is retrieved. For example, user code for the application to run is retrieved from a Github repository (where the user specifies the location or URL of the application code).

At 204, Unikernel build configuration options are identified. For example, a user may specify or declare, via a unikernel configuration user interface (e.g., the example UI shown in FIG. 4), various parameters of the unikernel build process. In some embodiments, a stored build pack (e.g., the example build pack described in conjunction with FIGS. 3A-3C) is referred to identify the build configuration options. One example of a build configuration option is indicating whether a volume is mutable.

At 206, the code is analyzed to determine portions of an operating system required to execute the code. The determined portions of the operating system include libraries required by the code. Flags may be set during the build process (e.g., flags to be set when linking against a determined library). Hashed, verified, and pre-compiled versions of libraries may be obtained. In some embodiments, one or more system calls are rewritten. This may include stubbing out system calls, such as those system calls that will cause forking. The analysis of the code may further include determining whether execution of the code will fail. If execution of the code will fail, a notification may be sent indicating that execution of the code will fail. Further details regarding code analysis are described above.

At 208, the code is (cross) compiled with the determined portions of the operating system into a unikernel that is deployable on a virtual machine to execute the code. Further details regarding compiling are described above. As described above, shell code is not allowed to execute after the virtual machine is deployed.

Figure 3A:
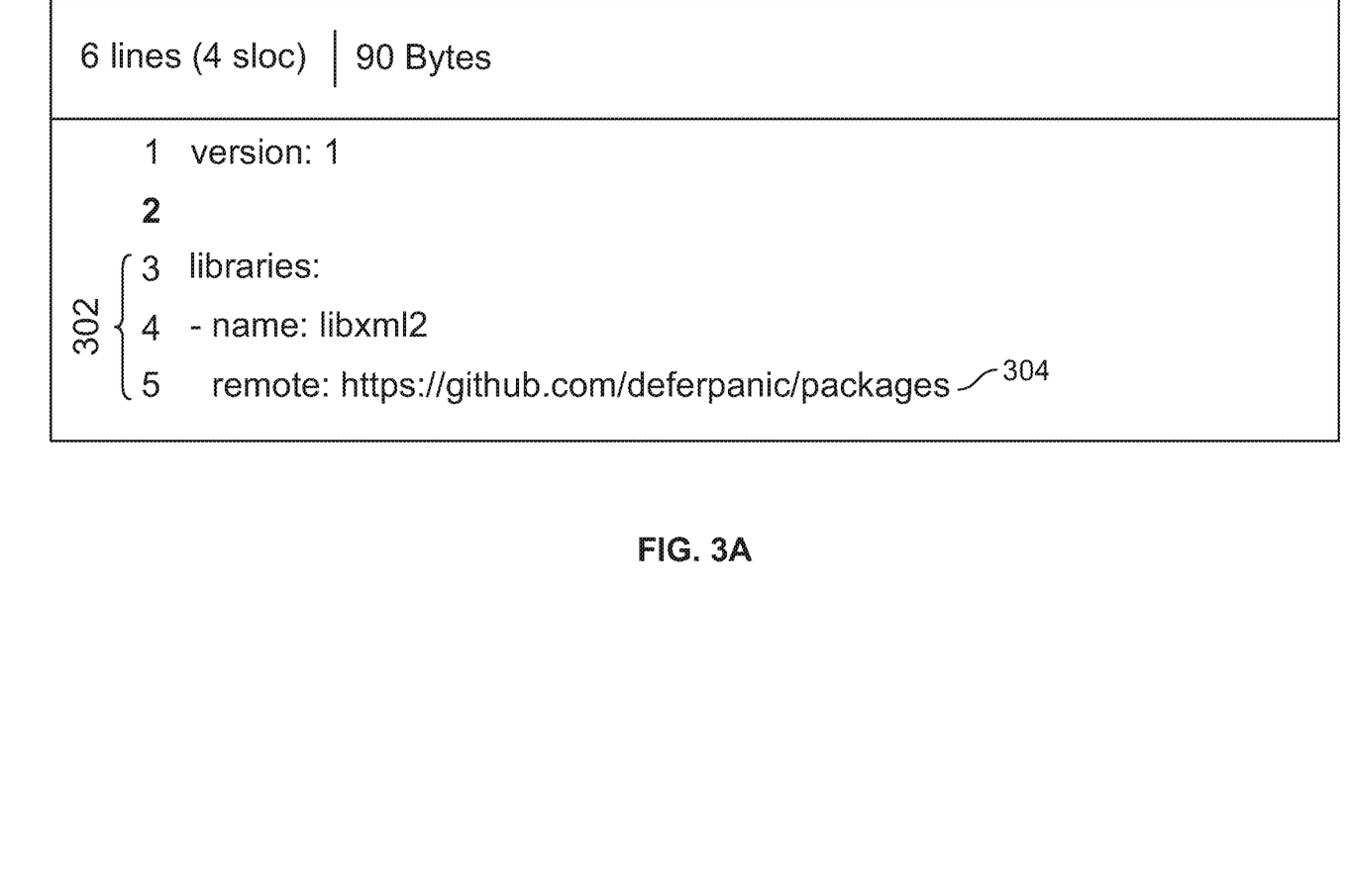
FIG. 3A illustrates an example first portion of a build pack.
Figure 3B:
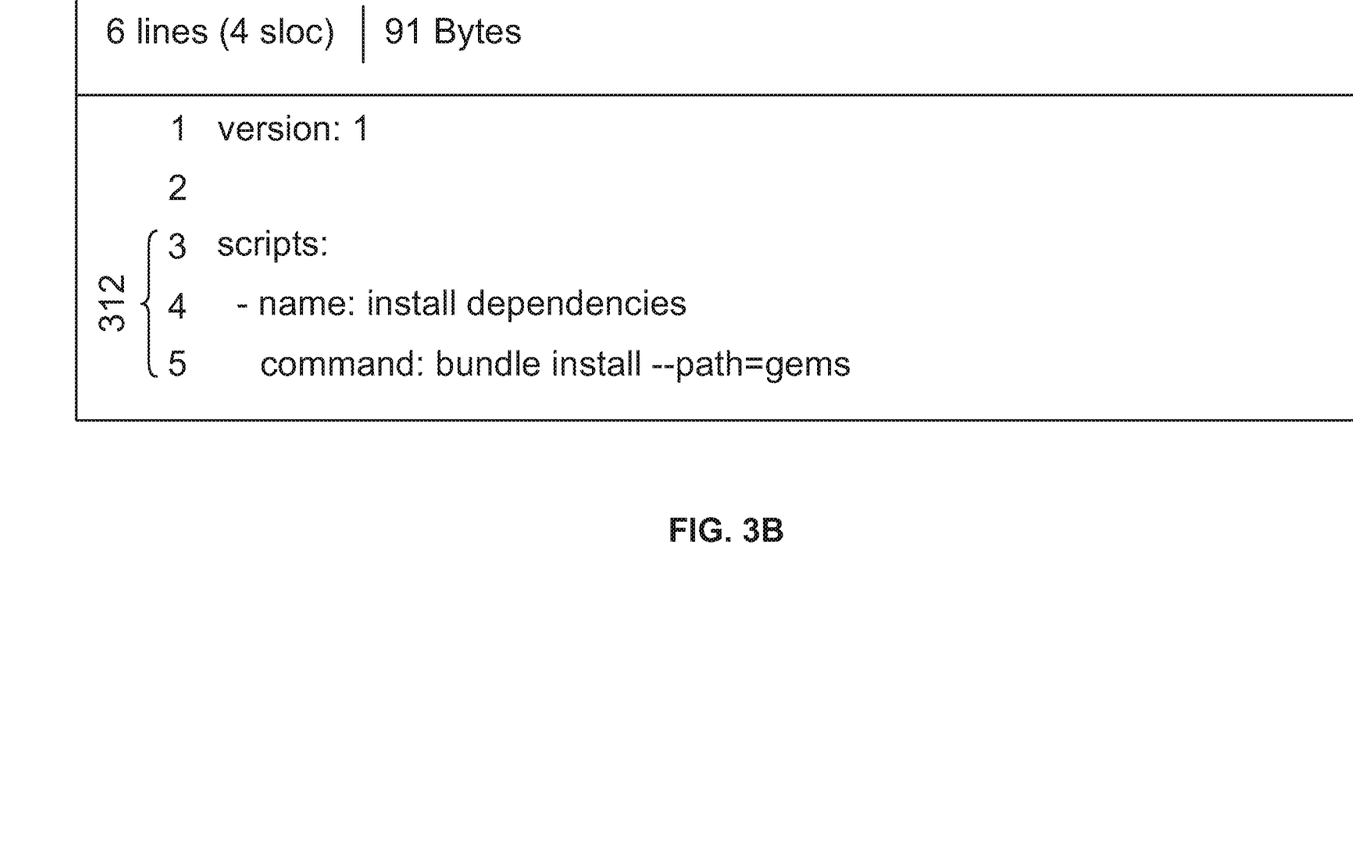
FIG. 3B illustrates an example second portion of the build pack.
Figure 3C:
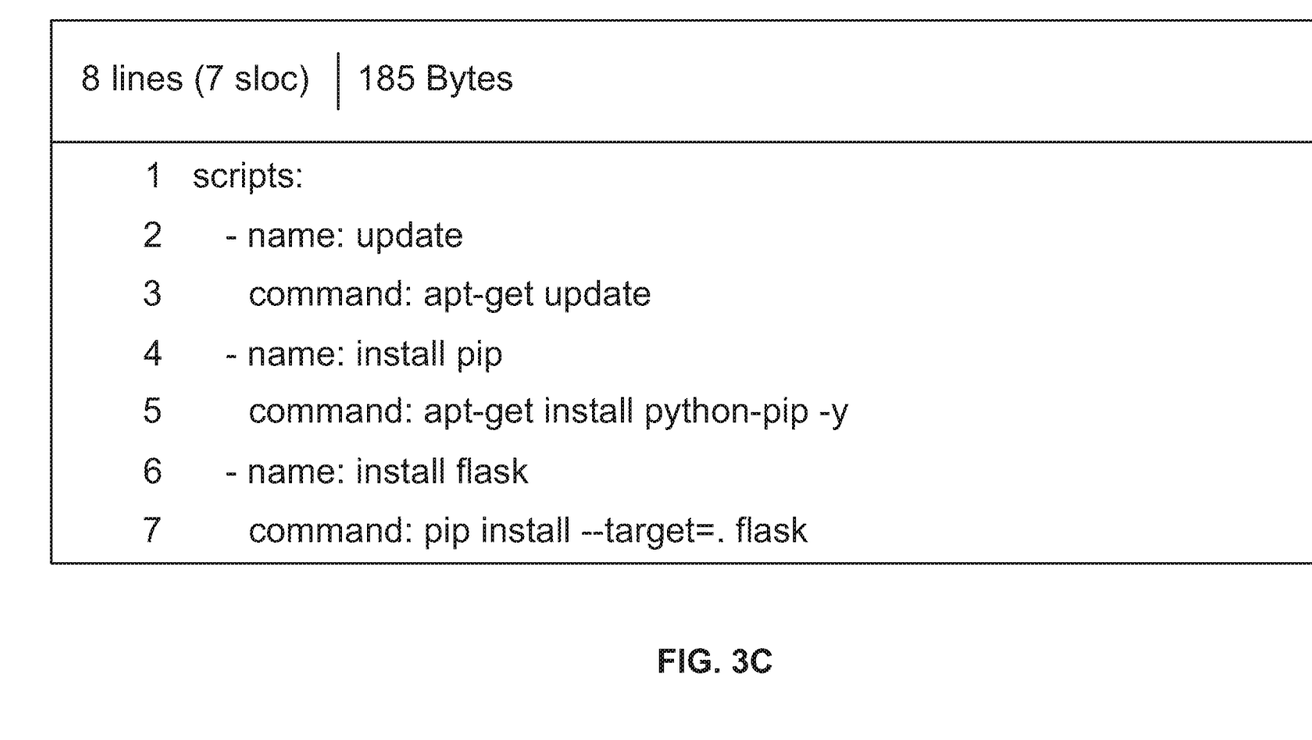
FIG. 3C illustrates an example third portion of the build pack.

FIGS. 3A-3C illustrate an example embodiment of a build pack. FIGS. 3A-3C illustrate an example of a declarative build process.

FIG. 3A illustrates an example first portion of a build pack. In the example of FIG. 3A, libraries section 302 includes 'libxml2,' an example of a common library that is linked against a large number of web applications (as it may include many helper functions that other underlying software uses). In the example shown, the 'remote' line 304 specifies the use of the location of /deferpanic/packages, which holds a pre-compiled library, metadata of the build, a hash, and any flags (e.g., CFLAGS, LDFLAGS, etc.).

FIG. 3B illustrates an example second portion of the build pack. Continuing from the example of FIG. 3A, in the example of FIG. 3B, a 'scripts' section 312 of the build pack is shown. This section allows the end user to specify various ad hoc scripting that they might wish to perform during the pre-build or post-build phase of compiling. This occurs within the build environment (e.g., build chroot). In the example shown, the user is bundling Ruby gems inside of their environment.

Figure 4:
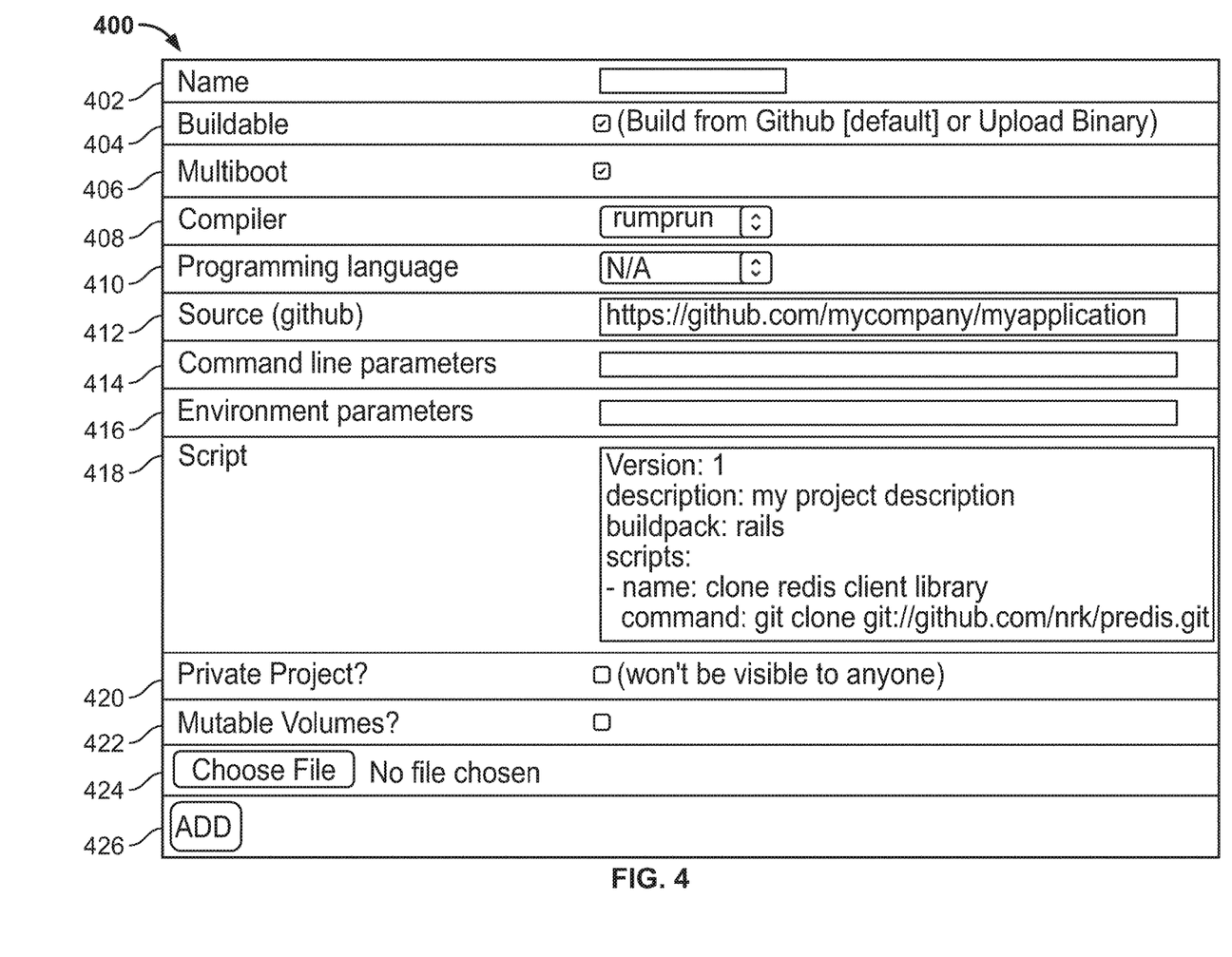
FIG. 4 illustrates an embodiment of a unikernel configuration user interface.

FIG. 3C illustrates an example third portion of the build pack. Continuing from the example of FIG. 3B, in the example of FIG. 3C, updating of the chroot build environment, installing of pip (a Python dependency manager), and installing of a Python web application server (flask, in this example) are shown. In one example, the aforementioned updating and installing are specified in a 'script' text area box such as script field 418 of FIG. 4. In the example of FIG. 4, the placeholder text in field 418 shows the syntax 'buildpack: rails.' As one example, the build pack specifies the following:

ruby version 2.2.4
rails version 4.1.7
libraries to be linked:
libsqlite
libcrypto
libcrypt
libdb
libffi
libgdbm
libgmp
libncursesw
libreadline
libruby
libssl
libutil
libyaml
libz The above dependencies are those that are necessary for the application to actually compile/boot/run. One dependency is a specific language. One dependency is a specific project version and the remaining are C libraries that need to be linked. As described above, these dependencies must be declared or otherwise determined (e.g., based on code analysis) and linked in ahead of time. Thus, without using the code analysis described above or without declaring the dependencies all up front, the application will not be able to execute. However, in this example, if the user specifies the one line 'buildpack: rails,' all of the dependencies are compiled/linked in automatically in a manner that is easy to support.

In some embodiments, a smaller set of commonly used build packs is maintained/stored that users could specify. A much larger set of libraries and interpreter versions (that most users might not care about or interact with) may be composed in the example declarative format described above so that the users may be able to use them more quickly and easily without knowing precisely what needs to be included. Such build packs may be stored in a data store such as build packs database 122 of FIG. 1.

FIG. 4 illustrates an embodiment of a unikernel configuration user interface. In some embodiments, user interface 400 is provided by platform 104 of FIG. 1. Interface 400 includes fields for declaring a name (402), buildable status (404), multiboot status (406), compiler (408), programming language (410), user code source (412), command line parameters (414), environment parameters (416), script (418), private project status (420), mutable volumes status (422), and choose file option (424). A build or "add" button 426 is also shown in this example. Further details regarding such unikernel build process/compilation configuration options are described above in conjunction with FIG. 1. Further details regarding the script field 418 are also described above in conjunction with FIGS. 3A-3C.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a processor configured to:
      retrieve application code from a code repository;

identify one or more unikernel build configuration options;

analyze the retrieved application code;

based at least in part on the analysis of the application code:

determine one or more libraries required to execute the application code:

obtain pre-compiled versions of the determined one or more libraries required to execute the application code; and modify the application code, wherein modifying the application code based at least in part on the analysis of the application code comprises modifying a system call in the application code, and wherein modifying the system call in the application code comprises at least one of removing the system call and rewriting the system call; and compile the modified application code and the obtained pre-compiled versions of the determined one or more libraries into a unikernel image that is deployable on a virtual machine; and a memory coupled to the processor and configured to provide the processor with instructions.

2. The system of claim 1, wherein the processor is further configured to obtain a previously verified version of a determined library.

3. The system of claim 2, wherein the previously verified version of the determined library is hashed.

4. The system of claim 1, wherein the processor is further configured to set one or more flags based at least in part on a determined library.

5. The system of claim 1, wherein at least some of the one or more unikernel build configuration options are obtained from a build pack.

6. The system of claim 1, wherein at least some of the one or more unikernel build configuration options are obtained via a user interface.

7. The system of claim 1, wherein the one or more unikernel build configuration options include an indication of whether the unikernel image is associated with a mutable volume.

8. The system of claim 1, wherein shed code is not permitted to execute after compiling the modified application code and the obtained pre-compiled versions of the determined one or more libraries into the unikernel image.

9. A method, comprising:

retrieving application code from a code repository;

identifying one or more unikernel build configuration options;

analyzing the retrieved application code;

based at least in part on the analysis of the application code:

determining one or more libraries required to execute the application code:

obtaining pre-compiled versions of the determined one or more libraries required to execute the application code; and modifying the application code, wherein modifying the application code based at least in part on the analysis of the application code comprises modifying a system call in the application code, and wherein modifying the system call in the application code comprises at least one of removing the system call and rewriting the system call; and compiling the modified application code and the obtained pre-compiled versions of the determined one or more libraries into a unikernel image that is deployable on a virtual machine.

10. The method of claim 9, further comprising obtaining a previously verified version of a determined library.

11. The method of claim 10, wherein the previously verified version of the determined library is hashed.

12. The method of claim 9, further comprising setting one or more flags based at least in part on a determined library.

13. The method of claim 9, wherein at least some of the one or more unikernel build configuration options are obtained from a build pack.

14. The method of claim 9, wherein at least some of the one or more unikernel build configuration options are obtained via a user interface.

15. The method of claim 9, wherein shell code is not permitted to execute after compiling the modified application code and the obtained pre-compiled versions of the determined one or more libraries into the unikernel image.

16. The system of claim 1, wherein modifying the system call in the application code comprises removing a system call in the application code that causes a process to fork.

17. The system of claim 1, wherein modifying the system call in the application code comprises rewriting a system call in the application code based at least in part on a determination of whether execution of the application code will fail, wherein the determination of whether execution of the application code will fail is based at least in part on the analysis of the application code.

18. A computer program product embodied in a non-transitory computer readable storage medium and comprising computer instructions for:

retrieving application code from a code repository;

identifying one or more unikernel build configuration options;

analyzing the retrieved application code;

based at least in part on the analysis of the application code:

determining one or more libraries required to execute the application code:

obtaining pre-compiled versions of the determined one or more libraries required to execute the application code; and modifying the application code, wherein modifying the application code based at least in part on the analysis of the application code comprises modifying a system call in the application code, and wherein modifying the system call in the application code comprises at least one of removing the system call and rewriting the system call; and compiling the modified application code and the obtained pre-compiled versions of the determined one or more libraries into a unikernel image that is deployable on a virtual machine.

\* \* \* \* \*